(12) United States Patent
Su et al.

(10) Patent No.: US 7,196,002 B2
(45) Date of Patent: Mar. 27, 2007

(54) METHOD OF MAKING DUAL DAMASCENE WITH VIA ETCH THROUGH

(75) Inventors: Yi-Nien Su, Kaohsiung (TW); Yi-Chen Huang, Taichung (TW); Jyu-Horng Shieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 51 days.

(21) Appl. No.: 10/914,394

(22) Filed: Aug. 9, 2004

(65) Prior Publication Data

US 2006/0030159 A1 Feb. 9, 2006

(51) Int. Cl.
*H01L 21/4763* (2006.01)

(52) U.S. Cl. ............ 438/618; 438/620; 438/623; 438/626; 438/627; 438/637; 438/638

(58) Field of Classification Search ............... None
See application file for complete search history.

(56) References Cited

U.S. PATENT DOCUMENTS

| | | | |
|---|---|---|---|
| 6,042,999 A | 3/2000 | Lin et al. ............... 430/316 |
| 6,080,655 A * | 6/2000 | Givens et al. ............ 438/626 |
| 6,316,351 B1 | 11/2001 | Chen et al. ............... 438/638 |
| 6,352,921 B1 * | 3/2002 | Han et al. ................ 438/638 |
| 6,362,093 B1 * | 3/2002 | Jang et al. ............... 438/633 |
| 6,833,318 B2 * | 12/2004 | Weng et al. .............. 438/631 |
| 6,930,038 B2 * | 8/2005 | Lin et al. ................. 438/633 |
| 2005/0054194 A1 * | 3/2005 | Tsai et al. ................ 438/638 |

\* cited by examiner

*Primary Examiner*—Duy-Vu N. Deo
(74) *Attorney, Agent, or Firm*—Thomas, Kayden, Horstemeyer & Risley

(57) ABSTRACT

A method for fabricating dual damascene structures having improved IC performance and reduced RC delay characteristics is provided. In one embodiment, a substrate with an etch stop layer formed thereon is provided. A dielectric layer is formed on the etch stop layer and an anti-reflective coating layer is formed on the dielectric layer. A first patterned photoresist layer having a via hole pattern is formed on the anti-reflective coating layer. The via hole pattern is thereafter etched through the anti-reflective coating layer, the dielectric layer, and the etch stop layer to form a via hole. A sacrificial via fill layer is filled in the via hole. A second patterned photoresist layer having a trench pattern is formed above the sacrificial via fill layer. The trench pattern is etched into the sacrificial via fill layer, the anti-reflective coating layer, and the dielectric layer to form a trench. The sacrificial via fill layer is removed in the via hole. A conductive layer is thereafter formed in the via hole and trench.

25 Claims, 6 Drawing Sheets

METHOD OF MAKING DUAL DAMASCENE WITH VIA ETCH THROUGH

BACKGROUND

The present invention relates generally to the formation of integrated circuit structures, and particularly, but not by way of limitation, to methods for forming dual damascene structures.

With the advent of ultra large-scale integration (ULSI) circuits, the number of interconnections in a semiconductor substrate has increased astronomically. The interconnections are made between passive and active devices within the substrate, as well as between a multitude of wiring layers that constitute the circuits on the substrate. The dual damascene process is a well-known technique for forming interconnections in semiconductor devices. The dual damascene process creates both the vias and lines for each metal layer by etching vias and trenches in the dielectric layer, depositing a conductor such as copper in the etched features and using a planarization process such as chemical mechanical planarization (CMP) to remove the excess copper.

There are many possible scenarios for a dual damascene process flow. FIGS. 1a–1g illustrate a prior art method for forming a damascene structure. In FIG. 1a, a via hole pattern having an opening 5 has been formed in first photoresist layer 40 on a stack consisting of anti-reflective coating layer 30, dielectric layer 20, etch stop layer 10, and a substrate (not shown). The via hole pattern is etch transferred through the underlying layers consisting of anti-reflective coating layer 30 and dielectric layer 20 and partially transferred through etch stop layer 10 to form a via hole as shown in FIG. 1b. After first photoresist layer 40 is stripped, a sacrificial via fill layer 50 is filled in the via hole with overburden and thereafter, a second photoresist layer 60 having a trench pattern with opening 6 is formed above the sacrificial via fill layer 50 as depicted in FIGS. 1c and 1d. The trench pattern is etch transferred through sacrificial via fill layer 50, anti-reflective coating layer 30 and partially through dielectric layer 20 to form a trench. It is understood that one function of the sacrificial via fill layer is to decrease the etching rate of dielectric layer 20. Second photoresist layer 60 and sacrificial via fill layer 50 may thereafter be removed by dry plasma ash or wet chemistry and the remaining structure is shown in FIG. 1e. FIG. 1f shows that the remaining etch stop layer 10 completely removed by dry plasma ash or wet chemistry. A conductive layer 70 is thereafter deposited to fill via and trench openings and after a planarization step, the completed damascene structure appears as illustrated in FIG. 1g.

While dual damascene methods are desirable in semiconductor device fabrication, dual damascene methods are nonetheless not entirely without problems. One such problem that may occur is during the process of removing the photoresist, the etch stop layer, or the sacrificial via fill layer. Conventionally, photoresist may be removed by either dry plasma ash or wet chemistry. If dry plasma ash is utilized however, such as by ashing in an oxygen (O2) plasma, a number of defects may occur on the wafer or trench surface. One such defect is damage to the dielectric layer in that the dielectric constant k (commonly less than 4) of the dielectric layer typically increases which then increases the overall dielectric constant of the dual damascene structure. This has the adverse effect of increasing the RC delay which in turn degrade circuit performance. Another defect that may occur in damascene patterning is the development of trench surface micro-roughening as shown in FIG. 1f when the etch stop layer is removed by dry plasma ash. Yet another defect is the occurrence of micro-trenching on the trench surface. Both the micro-roughening and the micro-trenching are small-scale deviation of the trench surface from a nominal plane surface, with many small, closely spaced peaks and valleys. They are undesirable and create IC performance and delay problems by causing additional processing and costly rework before a clean via hole and/or trench opening can be achieved and metal deposition can proceed.

For these reasons and other reasons that will become apparent upon reading the following detailed description, there is a need for an improved method of forming dual damascene structures that have an overall low dielectric constant, reduced RC delay characteristics and avoids the reliability and IC performance problems associated with conventional methods of forming dual damascene structures.

SUMMARY

The present invention is directed to methods for fabricating dual damascene structures having improved IC performance and reduced RC delay characteristics. In one embodiment, a substrate with an etch stop layer formed thereon is provided. A dielectric layer is formed on the etch stop layer and an anti-reflective coating layer is formed on the dielectric layer. A first patterned photoresist layer having a via hole pattern is formed on the anti-reflective coating layer. The via hole pattern is thereafter etched through the anti-reflective coating layer, the dielectric layer, and the etch stop layer to form a via hole. A sacrificial via fill layer is filled in the via hole. A second patterned photoresist layer having a trench pattern is formed above the sacrificial via fill layer. The trench pattern is etched into the sacrificial via fill layer, the anti-reflective coating layer, and the dielectric layer to form a trench. The sacrificial via fill layer is removed in the via hole. A conductive layer is thereafter formed in the via hole and trench.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1A:
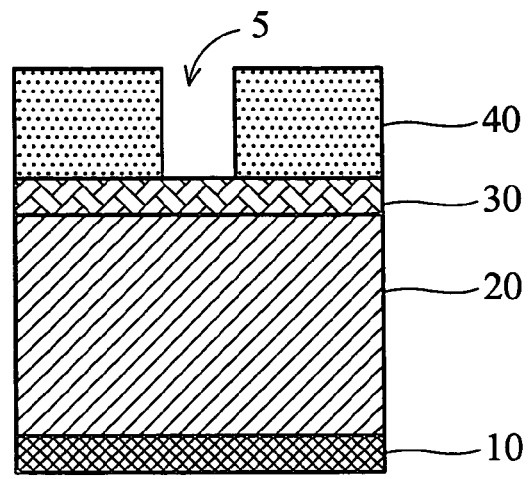
FIGS. 1a–1g are cross-sectional views depicting a prior art method of forming a dual damascene structure.
Figure 1B:
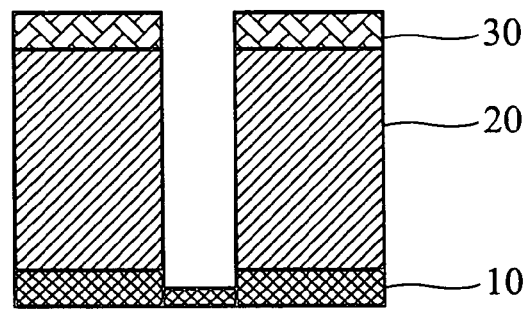
Figure 1C:
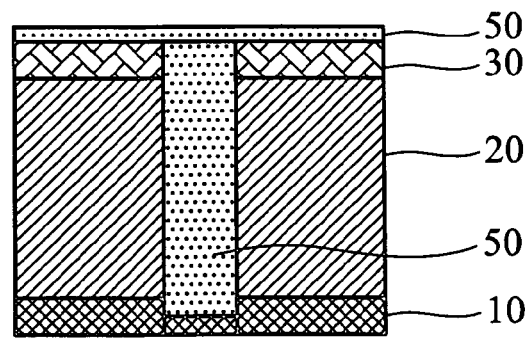
Figure 1D:
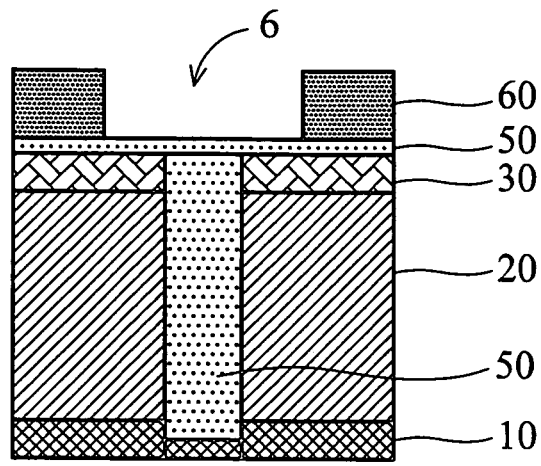
Figure 1E:
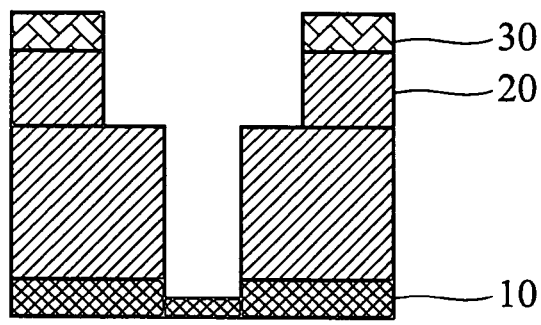
Figure 1F:
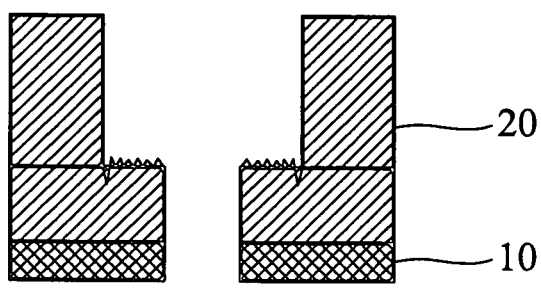
Figure 1G:
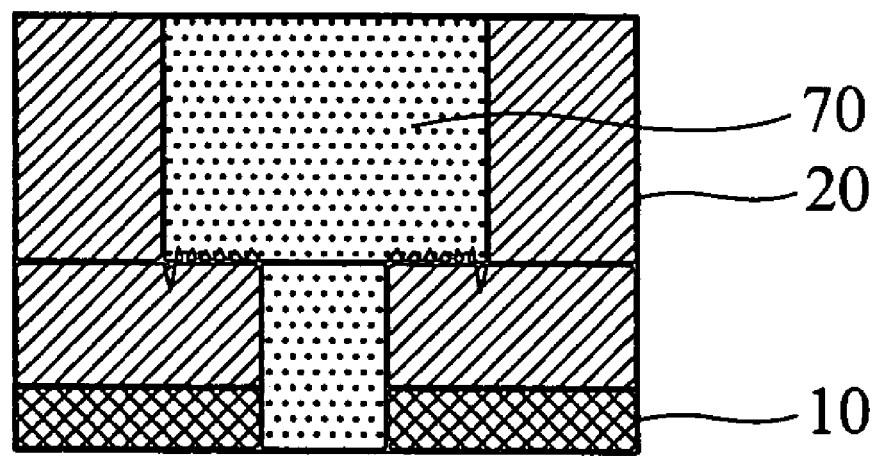
Figure 2A:
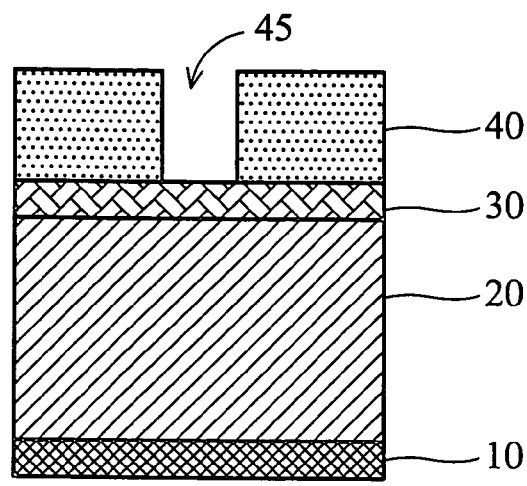
FIG. 2a is a schematic cross-sectional view of a formation of a dual damascene structure showing an etch stop layer formed on a substrate, a dielectric layer formed on the etch stop layer, an anti-reflective coating layer formed on the dielectric layer, and a first patterned photoresist layer having a via hole pattern formed on the anti-reflective coating layer according to one embodiment of the present invention.

FIGS. 2a through 2g illustrate schematic cross-sectional views of a formation of a dual damascene structure, by way of example, but not by way of limitation, according to one embodiment of the present invention. As depicted in FIG. 2a, a dual damascene structure shows an etch stop layer 10 formed on a substrate (not shown), a dielectric layer 20 formed on the etch stop layer 10, an anti-reflective coating layer (ARC) 30 formed on the dielectric layer 20, and a first patterned photoresist layer 40 having a via hole pattern formed on the anti-reflective coating layer 30 according to one embodiment of the present invention.

Although not specifically illustrated within the schematic cross-sectional diagram of FIG. 2a, the substrate may be a substrate as employed within the microelectronic fabrication and usually include active and passive devices and may have formed thereupon and/or thereover any of several additional microelectronic layers as are conventionally employed within the microelectronic fabrication. These layers may include, for example, conductor materials, semiconductor materials and dielectric materials. In one embodiment, the substrate includes a contact region (not shown), the contact region being exposed by a subsequently formed via hole following a via hole pattern etching step. It is understood that the type of the substrate is a design choice dependent on the fabrication process being employed. Etch stop layer 10 may comprise a material such as for example, silicon nitride (SiN), silicon oxynitride (SiON), or silicon carbide (SiC), have a thickness of from about 200 angstroms to about 600 angstroms, and be deposited conformally by a process such as chemical vapor deposition (CVD). Next, dielectric layer 20 comprising a material such as silicon dioxide (SiO2) may be deposited by a CVD or spin on method as is known to those skilled in the art. Anti-reflective coating layer 30 comprising of photoresist materials, SiN, SiON, or SiOC and having a thickness of from about 300 angstroms to about 1,000 angstroms is thereafter deposited by conventional CVD procedures over dielectric layer 20. Anti-reflective coating layer 30 serves to control the dimensional integrity (CD control, as is known in the art) during a subsequent etch step.

Figure 2B:
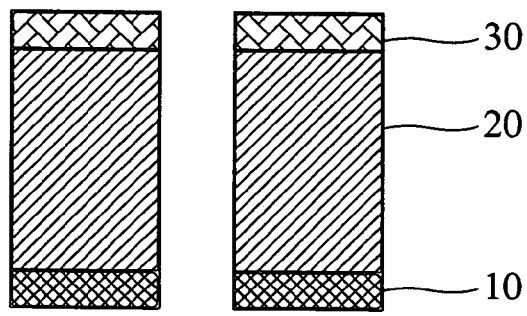
FIG. 2b is a schematic cross-sectional view of the structure of FIG. 2a showing the via hole pattern etched through the anti-reflective coating layer, the dielectric layer, and the etch stop layer to form a via hole according to one embodiment of the present invention.

A first photoresist layer 40 is next formed and patterned with a via hole pattern 45 using conventional methods, as shown in FIG. 2a. First photoresist layer 40 may be formed of photoresist materials as are conventional in the art of semiconductor fabrication, such as photoresist materials being selected from the general groups of photoresist materials including but not limited to positive photoresist materials and negative photoresist materials. Via hole pattern 45 is then etched through the anti-reflective coating layer 30, the dielectric layer 20, and the etch stop layer 10 to form a via hole. FIG. 2b shows the damascene structure after the first patterned photoresist layer 40 has been stripped by conventional methods and materials; such methods and materials may typically, but not exclusively, include wet chemical solvent stripping methods and materials and dry oxygen plasma stripping methods and materials.

Figure 2C:
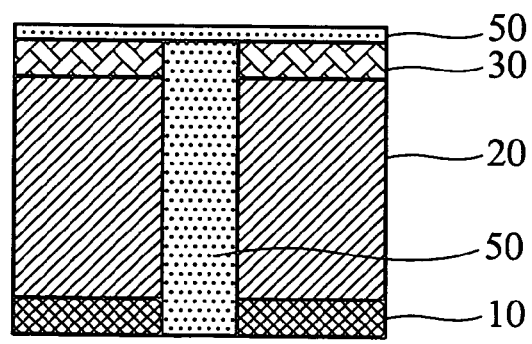
FIG. 2c is a schematic cross-sectional view of the structure of FIG. 2b showing the filling of a sacrificial via fill layer in the via hole according to one embodiment of the present invention.

FIG. 2c is a schematic cross-sectional view of the structure of FIG. 2b showing the filling of a sacrificial via fill layer 50 in the via hole according to one embodiment of the present invention. Sacrificial via fill layer 50 may be formed by conventional CVD processes and may be comprised of BARC materials, spin on polymer (SOP) materials, spin on organic dielectric materials, SiLK, benzocyclobutene, FLARE™, Nautilus™, or Telflon™. Sacrificial via fill layer 50 preferably comprises of a material which is not exceedingly etched more than dielectric layer 20 within an etching plasma environment, but may nonetheless also readily be stripped away from the damascene structure. In one embodiment, sacrificial via fill layer 50 fills completely the via hole and forms a thin film or overburden on anti-reflective coating layer 30. Optionally, sacrificial via fill layer 50 may be planarized using conventional CMP processes so that the surface thereof is substantially coplanar with the top of the anti-reflective coating layer 30. In another embodiment, the sacrificial via fill layer 50 is filled to at least a lower portion of the via hole, the lower portion being of at least 30 percent of the total via hole height.

Figure 2D:
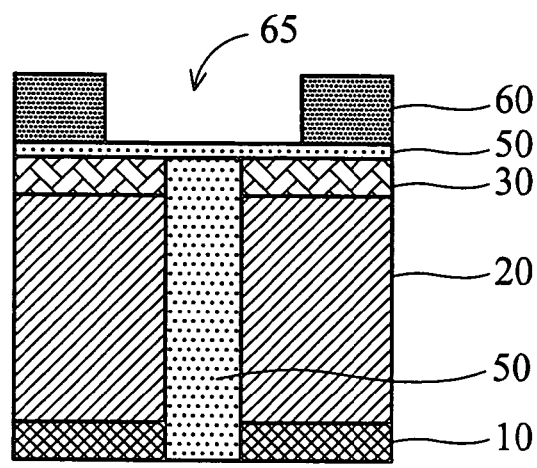
FIG. 2d is a schematic cross-sectional view of the structure of FIG. 2c showing a second patterned photoresist layer having a trench pattern formed above the sacrificial via fill layer according to one embodiment of the present invention.
Figure 2E:
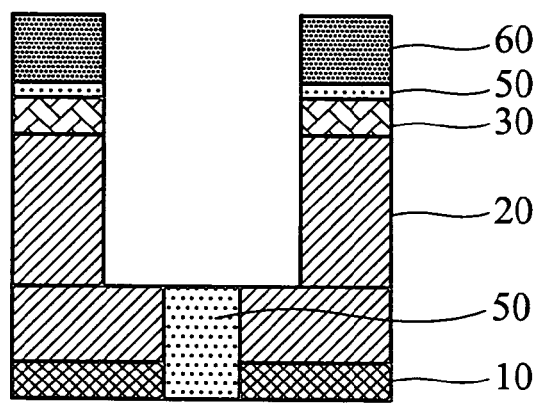
FIG. 2e is a schematic cross-sectional view of the structure of FIG. 2d showing the trench pattern etched into the sacrificial via fill layer, the anti-reflective coating layer, and the dielectric layer to form a trench according to one embodiment of the present invention.
Figure 2F:
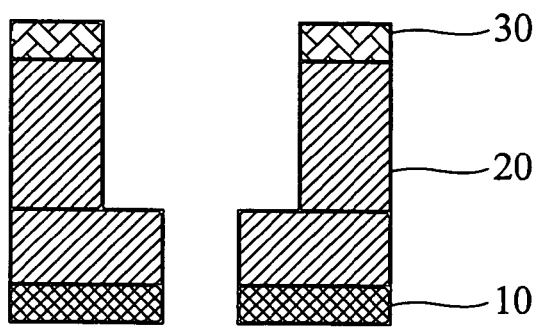
FIG. 2f is a schematic cross-sectional view of the structure of FIG. 2e showing the removal of the sacrificial via fill layer in the via hole according to one embodiment of the present invention.

FIG. 2d is a schematic cross-sectional view of the structure of FIG. 2c showing a second patterned photoresist layer 60 having a trench pattern 65 formed above the sacrificial via fill layer 50 according to one embodiment of the present invention. Second photoresist layer 60 is formed and patterned with a trench pattern 65 using conventional methods and may be formed of conventional photoresist materials. Trench pattern 65 is then etched into the sacrificial via fill layer 50, anti-reflective coating layer 30, and the dielectric layer 20 to form a trench as shown in FIG. 2e. Second patterned photoresist layer 60 is thereafter stripped by conventional methods and materials, such methods and materials may typically, but not exclusively, include wet chemical solvent stripping methods and materials and dry oxygen plasma stripping methods and materials. Sacrificial via fill layer 50 in the via hole is then removed by dry or wet chemistry and the resultant damascene structure is shown in FIG. 2f. It is understood that in one embodiment of the method of the present invention, the problems of microroughness and micro-trenching associated with the conventional dual damascene method are avoided because no removing of etch stop layer 10 by ashing is necessary because etch stop layer 10 has previously been removed prior to trench formation.

Figure 2G:
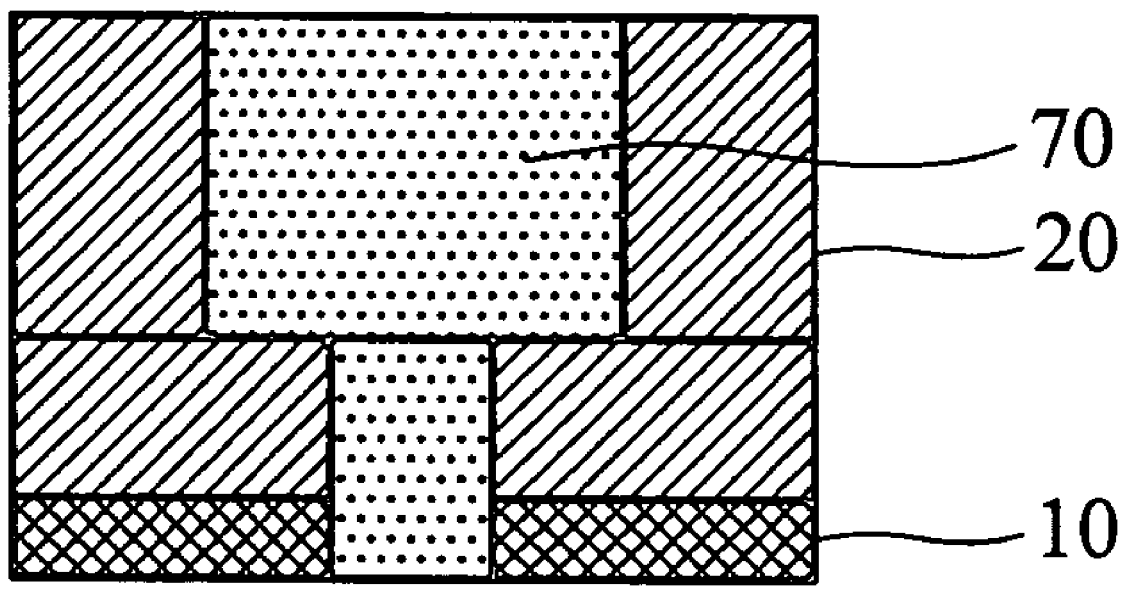
FIG. 2g is a schematic cross-sectional view of the structure of FIG. 2f showing the formation of a conductive layer in the trench and via hole according to one embodiment of the present invention.

FIG. 2g is a schematic cross-sectional view of the structure of FIG. 2f showing the formation of a conductive layer 70 in the trench and via hole according to one embodiment of the present invention. The conductive layer 70 may comprise of conductive materials, such as for example, copper, copper alloy, aluminum, aluminum alloy and may be deposited by conventional deposition processes. Thereafter, a chemical mechanical planarization step is performed in order to remove the excess conductive material and planarize the surface and form the damascene structure as shown in FIG. 2g. Finally, the damascene structure of the present invention may be completed by forming a passivation layer (not shown) to serve as a top barrier lid for the conductive interconnect, or as an etch stop layer for the next level of metallization as warranted by design rules.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of forming a dual damascene structure, comprising:
   providing a substrate with an etch stop layer formed thereabove;
   forming a dielectric layer above the etch stop layer;
   forming an anti-reflective coating layer above the dielectric layer;
   forming a first patterned photoresist layer above the anti-reflective coating layer, the first patterned photoresist layer having a via hole pattern;
   etching through the via hole pattern in the anti-reflective coating layer, the dielectric layer, and the etch stop layer to form a via hole, wherein the etch stop layer in the via hole is completely removed in the same etching step;
   filling the via hole with a sacrificial via fill layer;
   forming a second patterned photoresist layer above the sacrificial via fill layer, the second patterned photoresist layer having a trench pattern;
   etching the trench pattern into the sacrificial via fill layer, the anti-reflective coating layer, and the dielectric layer to form a trench, wherein the trench is not substantially adjacent to the etch stop layer;
   removing the sacrificial via fill layer in the via hole; and
   forming a conductive layer in the via hole and trench.

2. The method of claim 1, wherein the etch stop layer has a thickness of from about 200 angstroms to about 600 angstroms.

3. The method of claim 1, wherein the anti-reflective coating layer comprises photoresist materials, SiN, SiON, or SiOC and has a thickness of from about 300 angstroms to about 1,000 angstroms.

4. The method of claim 1, further comprising:
   removing the first patterned photoresist layer subsequent to the step of etching the via hole pattern.

5. The method of claim 1, wherein the sacrificial via fill layer is filled to at least a lower portion of the via hole.

6. The method of claim 1, wherein the sacrificial via fill layer is filled above the anti-reflective coating layer.

7. The method of claim 1, wherein the sacrificial via fill layer comprises BARC materials, spin on polymer (SOP) materials, spin on organic dielectric material, SiLK, benzocyclobutene, FLARE™, Nautilus™, or Teflon™.

8. The method of claim 1, further comprising:
   subsequent to the filling step, planarizing the sacrificial via fill layer so that the surface thereof is substantially coplanar with the top of the anti-reflective coating layer.

9. The method of claim 1, further comprising:
   removing the second patterned photoresist layer subsequent to the step of etching the trench pattern.

10. The method of claim 1, further comprising:
    removing the sacrificial via fill layer by dry or wet chemistry.

11. The method of claim 1, further comprising:
    planarizing the conductive layer so that the surface thereof is substantially coplanar with the top of the dielectric layer.

12. The method of claim 1, wherein the substrate includes a contact region, the contact region being exposed by the via hole following the via hole pattern etching step.

13. A method of making a semiconductor device, comprising:
    providing a substrate with an etch stop layer formed thereabove;
    forming a dielectric layer above the etch stop layer;
    forming an anti-reflective coating layer above the dielectric layer;
    forming a first patterned photoresist layer above the anti-reflective coating layer, the first patterned photoresist layer having a via hole pattern;
    etching through the via hole pattern in the anti-reflective coating layer, the dielectric layer, and the etch stop layer to form a via hole, wherein the etch stop layer in the via hole is completely removed in the same etching step;
    filling at least a lower portion of the via hole with a sacrificial via fill layer;
    forming a second patterned photoresist layer above the sacrificial via fill layer, the second patterned photoresist layer having a trench pattern;
    etching the trench pattern into the sacrificial via fill layer, the anti-reflective coating layer, and the dielectric layer to form a trench, wherein the trench is not substantially adjacent to the etch stop layer;
    removing the sacrificial via fill layer in the via hole; and
    forming a conductive layer in the via hole and trench.

14. The method of claim 13, wherein the etch stop layer has a thickness of from about 200 angstroms to about 600 angstroms.

15. The method of claim 13, wherein the anti-reflective coating layer comprises photoresist materials, SiN, SiON, or SiOC and has a thickness of from about 300 angstroms to about 1,000 angstroms.

16. The method of claim 13, further comprising:
    removing the first patterned photoresist layer subsequent to the step of etching the via hole pattern.

17. The method of claim 13, wherein the sacrificial via fill layer is filled to at least a lower portion of the via hole.

18. The method of claim 13, wherein the sacrificial via fill layer is filled above the anti-reflective coating layer.

19. The method of claim 13, wherein the sacrificial via fill layer comprises BARC materials, spin on polymer (SOP) materials, spin on organic dielectric material, SiLK, benzocyclobutene, FLARE™, Nautilus™, or Teflon™.

20. The method of claim 13, further comprising:
    subsequent to the filling step, planarizing the sacrificial via fill layer so that the surface thereof is substantially coplanar with the top of the anti-reflective coating layer.

21. The method of claim 13, further comprising:
removing the second patterned photoresist layer subsequent to the step of etching the trench pattern.

22. The method of claim 13, further comprising:
removing the sacrificial via fill layer by dry or wet chemistry.

23. The method of claim 13, further comprising:
planarizing the conductive layer so that the surface thereof is substantially coplanar with the top of the dielectric layer.

24. The method of claim 13, wherein the substrate includes a contact region, the contact region being exposed by the via hole following the via hole pattern etching step.

25. A method of forming a damascene structure, comprising:
providing a substrate with a barrier layer formed thereabove;
forming a dielectric layer above the barrier layer;
forming an anti-reflective coating layer above the dielectric layer;
etching through a via hole pattern in the anti-reflective coating layer, the dielectric layer, and the barrier layer to form a via hole, wherein the barrier layer in the via hole is completely removed in the same etching step;
filling the via hole with a plug;
etching a trench pattern into the plug, the anti-reflective coating layer, and the dielectric layer to form a trench, wherein the trench is not adjacent to the barrier layer;
removing the plug in the via hole; and
forming a conductive layer in the via hole and trench.

* * * * *